United States Patent
Sabacinski

(10) Patent No.: US 10,374,661 B2
(45) Date of Patent: Aug. 6, 2019

(54) RESONANCE WIRELESS POWER ENABLED PERSONAL PROTECTION EQUIPMENT

(71) Applicant: Scott Technologies, Inc., Boca Raton, FL (US)

(72) Inventor: Richard Joseph Sabacinski, Charlotte, NC (US)

(73) Assignee: Scott Technologies, Inc., Boca Raton, FL (US)

( * ) Notice: Subject to any disclaimer, the term of this patent is extended or adjusted under 35 U.S.C. 154(b) by 161 days.

(21) Appl. No.: 15/615,976

(22) Filed: Jun. 7, 2017

(65) Prior Publication Data

US 2017/0359101 A1 Dec. 14, 2017

Related U.S. Application Data

(60) Provisional application No. 62/347,827, filed on Jun. 9, 2016.

(51) Int. Cl.
| | | |
|---|---|---|
| *H04B 5/00* | (2006.01) | |
| *G01R 33/28* | (2006.01) | |

(Continued)

(52) U.S. Cl.
CPC ............ *H04B 5/0037* (2013.01); *A62B 9/00* (2013.01); *G01R 33/28* (2013.01); *H02J 7/0063* (2013.01); *H02J 50/12* (2016.02); *H02J 50/80* (2016.02); *H04B 5/0087* (2013.01); *A41D 1/002* (2013.01); *A62B 7/02* (2013.01); *A62B 17/003* (2013.01); *A62B 17/006* (2013.01); *A62B 18/02* (2013.01); *A62B 18/04* (2013.01); *H02J 7/025* (2013.01)

(58) Field of Classification Search
None
See application file for complete search history.

(56) References Cited

U.S. PATENT DOCUMENTS 9,568,572 B2 * 2/2017 Vaughan ............ G01R 33/3692
9,614,371 B1 * 4/2017 Farkas ...................... H02J 3/14
(Continued)

FOREIGN PATENT DOCUMENTS

| EP | 1 944 851 A2 | 7/2008 |
|---|---|---|
| EP | 2 403 101 A2 | 1/2012 |

(Continued)

OTHER PUBLICATIONS

Partial European Search Report dated Oct. 17, 2017 issued in corresponding European Patent Application No. 17175109.2, consisting of 17-pages.

(Continued)

*Primary Examiner* — Douglas X Rodriguez
(74) *Attorney, Agent, or Firm* — Christopher & Weisberg, P.A.

(57) ABSTRACT

A portable power source couplable to a life safety equipment. A magnetic resonance coupling source is included, the magnetic resonance coupling source is in electrical communication with the portable power source. The magnetic resonance coupling source is configured to wirelessly transmit power to at least one magnetic resonance coupling receiver included in a portable device when the at least one magnetic resonance coupling receiver is positioned within a maximum predetermined distance from the magnetic resonance coupling source.

18 Claims, 8 Drawing Sheets

(51) Int. Cl.
*H02J 7/00* (2006.01)
*H02J 50/12* (2016.01)
*H02J 50/80* (2016.01)
*A62B 9/00* (2006.01)
*A62B 7/02* (2006.01)
*A62B 17/00* (2006.01)
*A62B 18/02* (2006.01)
*H02J 7/02* (2016.01)
*A41D 1/00* (2018.01)
*A62B 18/04* (2006.01)

(56) References Cited

U.S. PATENT DOCUMENTS

| | | | | |
|---|---|---|---|---|
| 2004/0222638 | A1* | 11/2004 | Bednyak | B63J 3/04 |
| | | | | 290/1 R |
| 2009/0096413 | A1* | 4/2009 | Partovi | H01F 5/003 |
| | | | | 320/108 |
| 2012/0153740 | A1* | 6/2012 | Soar | F41H 1/02 |
| | | | | 307/104 |
| 2015/0069847 | A1 | 3/2015 | Meyer et al. | |
| 2015/0194841 | A1 | 7/2015 | Yeh | |
| 2016/0056664 | A1 | 2/2016 | Partovi | |

FOREIGN PATENT DOCUMENTS

| | | |
|---|---|---|
| EP | 2 773 009 A1 | 9/2014 |
| EP | 3139448 A1 | 3/2017 |
| WO | 2012/027824 A1 | 3/2012 |
| WO | 2015/162308 A1 | 10/2015 |

OTHER PUBLICATIONS

European Search Report dated Mar. 13, 2018 issued in corresponding European Application No. 17175109, consisting of 18 pages.

* cited by examiner

RESONANCE WIRELESS POWER ENABLED PERSONAL PROTECTION EQUIPMENT

CROSS-REFERENCE TO RELATED APPLICATION

This application is related to and claims priority to U.S. Provisional Patent Application No. 62/347,827, filed Jun. 9, 2016 and entitled "RESONANCE WIRELESS POWER ENABLED PERSONAL PROTECTION EQUIPMENT," the entire contents of which is incorporated herein by reference.

STATEMENT REGARDING FEDERALLY SPONSORED RESEARCH OR DEVELOPMENT n/a

TECHNICAL FIELD

The present invention relates to a personal protection equipment powering system, and in particular, a magnetic resonance power system for portable devices.

BACKGROUND

Personal protection equipment (PPE) refers to protective clothing, helmets, goggles, or other garments or equipment designed to protect the wearer's body from injury or infection. The hazards addressed by protective equipment include physical, electrical, heat, chemicals, biohazards, and airborne particulate matter. PPE often includes turnout gear, for example, a fireman's jacket, gloves, helmet, and electrically powered devices such as a self-contained breathing apparatus, flashlights, camera, portable devices, such as devices, and the like.

The devices associated with PPE often require large and unwieldy batteries to power them, thus the overall weight of each device is increased. Moreover, each battery associated with each device is typically charged individually and are drained at different rates depending on the device. Thus, a first responder often carries multiple heavy devices that may or may not have a battery sufficiently charged for use during use. Accordingly, a first responder may be delayed into action should one of the devices associated with PPE lacks a sufficiently charged battery.

SUMMARY

The present invention advantageously provides for a magnetic resonance powering system. In one embodiment, the system includes a portable power source couplable to a life safety equipment. A magnetic resonance coupling source is included, the magnetic resonance coupling source is in electrical communication with the portable power source. The magnetic resonance coupling source is configured to wirelessly transmit power to at least one magnetic resonance coupling receiver included in a portable device when the at least one magnetic resonance coupling receiver is positioned within a maximum predetermined distance from the magnetic resonance coupling source.

In another aspect of this embodiment, the system includes a garment, and the at least one magnetic resonance coupling source is affixed to the garment.

In another aspect of this embodiment, the garment includes a sleeve, and the at least one magnetic resonance coupling source is coupled to the sleeve.

In another aspect of this embodiment, the garment is a firefighter turnout gear.

In another aspect of this embodiment, the system further includes a glove, and the at least one magnetic resonance coupling source is coupled to the glove.

In another aspect of this embodiment, the system further includes an adhesive skin patch, and wherein the at least one magnetic resonance coupling source is coupled to the skin patch.

In another aspect of this embodiment, the magnetic resonance coupling source is connected with the portable power source by a conductor.

In another aspect of this embodiment, the portable power source includes a power source magnetic resonance coupling source, and the magnetic resonance coupling source is separated from the portable power source and includes a receiver coil and a source coil, the receiver coil receives wireless power from the power source magnetic resonance source and the source coil transmits wireless power to the at least one magnetic resonance coupling receiver.

In another aspect of this embodiment, the magnetic resonance coupling source further includes a radio frequency identification (RFID) reader, the RFID reader is configured to receive a portable device identifier associated with a portable device, and authentication processing circuitry, the authentication processing circuitry includes a memory configured to store a plurality of authorized portable device identifiers and programmatic authentication code. A processor in communication with the memory is included, the processor executing the programmatic authentication code to cause the RFID reader to receive the portable device identifier associated with the portable device, determine whether the received portable device identifier corresponds to an authorized portable device identifier, cause the portable power source to initiate the flow of power from the magnetic resonance coupling source to the at least one magnetic resonance coupling receiver when the received portable device identifier corresponds to an authorized portable device identifier.

In another aspect of this embodiment, the system further includes the portable device, and the portable device includes the portable device identifier.

In another aspect of this embodiment, the system further includes the portable device, the portable device having a radio frequency identification (RFID) reader, the RFID reader being configured to receive a power source identifier associated with the portable power source. The portable device further having authentication processing circuitry, the authentication processing circuitry including a memory configured to store a plurality of authorized power source identifiers and programmatic authentication code. a processor in communication with the memory is included, the processor executing the programmatic authentication code to cause the RFID reader to receive the power source identifier associated with the portable power source, determine whether the received power source identifier corresponds to an authorized power source identifier, cause the portable power source to initiate the flow of power from the magnetic resonance coupling source to the at least one magnetic resonance coupling receiver when the received power source identifier corresponds to an authorized power source identifier.

In another aspect of this embodiment, the life safety equipment includes a backpack assembly, and wherein the backpack assembly is configured to receive a self-contained breathing apparatus.

In another embodiment, the system includes a portable power source couplable to a life safety equipment. A magnetic resonance coupling source remote from the portable power source is included, the magnetic resonance coupling source is in in electrical communication with the portable power source. The magnetic resonance coupling source is configured to wirelessly transmit power to at least one magnetic resonance coupling receiver included in a portable device when the at least one magnetic resonance coupling receiver is positioned within a maximum predetermined distance from the magnetic resonance coupling source. The magnetic resonance coupling source is coupled to a garment.

In another aspect of this embodiment, the magnetic resonance coupling source is connected with the portable power source by a conductor.

In another aspect of this embodiment, the portable power source includes a power source magnetic resonance coupling source, and wherein the magnetic resonance coupling source is separated from the portable power source and includes a receiver coil and a source coil. The receiver coil receives wireless power from the power source magnetic resonance source and the source coil transmits wireless power to the at least one magnetic resonance coupling receiver.

In another aspect of this embodiment, the magnetic resonance coupling source further includes a radio frequency identification (RFID) reader, the RFID reader being configured to receive a portable device identifier associated with a portable device, and authentication processing circuitry. The authentication processing circuitry includes a memory configured to store a plurality of authorized portable device identifiers and programmatic authentication code. a processor in communication with the memory is included, the processor executing the programmatic authentication code to cause the RFID reader to receive the portable device identifier associated with the portable device determine whether the received portable device identifier corresponds to an authorized portable device identifier, and cause the portable power source to initiate the flow of power from the magnetic resonance coupling source to the at least one magnetic resonance coupling receiver when the received portable device identifier corresponds to an authorized portable device identifier.

In another aspect of this embodiment, the garment is a glove.

In another aspect of this embodiment, the garment is a jacket having a sleeve, and the at least one magnetic resonance coupling receiver is coupled to the sleeve.

In another aspect of this embodiment, life safety equipment includes a backpack assembly, and the backpack assembly is configured to receive a self-contained breathing apparatus.

In yet another embodiment, the system includes a portable power source couplable to a life safety equipment. The life safety equipment includes a backpack assembly configured to receive a self-contained breathing apparatus. A magnetic resonance coupling source physically coupled to the portable power source is included, the magnetic resonance coupling source being in electrical communication with the portable power source. The magnetic resonance coupling source is configured to wirelessly transmit power to at least one magnetic resonance coupling receiver included in a portable device when the at least one magnetic resonance coupling receiver is positioned within a maximum predetermined distance from the magnetic resonance coupling source. The magnetic resonance coupling source is coupled to a garment configured to be worn by the user during user of the portable device.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

As used herein, relational terms, such as "first" and "second," "over" and "under," "front" and "rear," "in, within, and around" and the like, may be used solely to distinguish one entity or element from another entity or element without necessarily requiring or implying any physical or logical relationship or order between such entities or elements. The magnetic resonance equipment powering system described herein provides for an easy and convenient system for wirelessly charging and/or powering portable devices such as devices with a single battery, as opposed to at least one battery in each device, which each battery having its own charge cycle and life.

Figure 1:
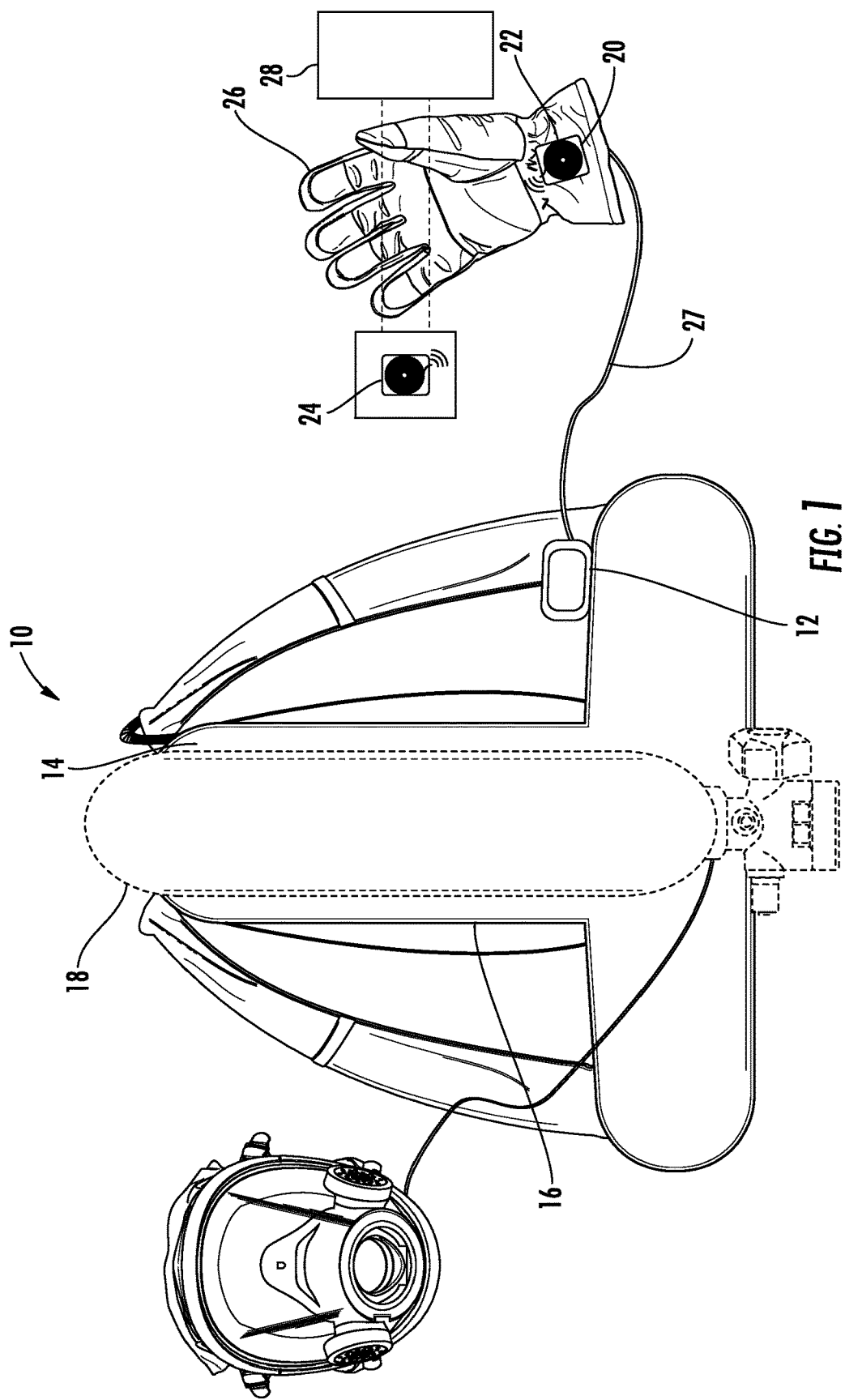
FIG. 1 is diagram of a magnetic resonance coupling power system with a glove and portable device.
Figure 2:
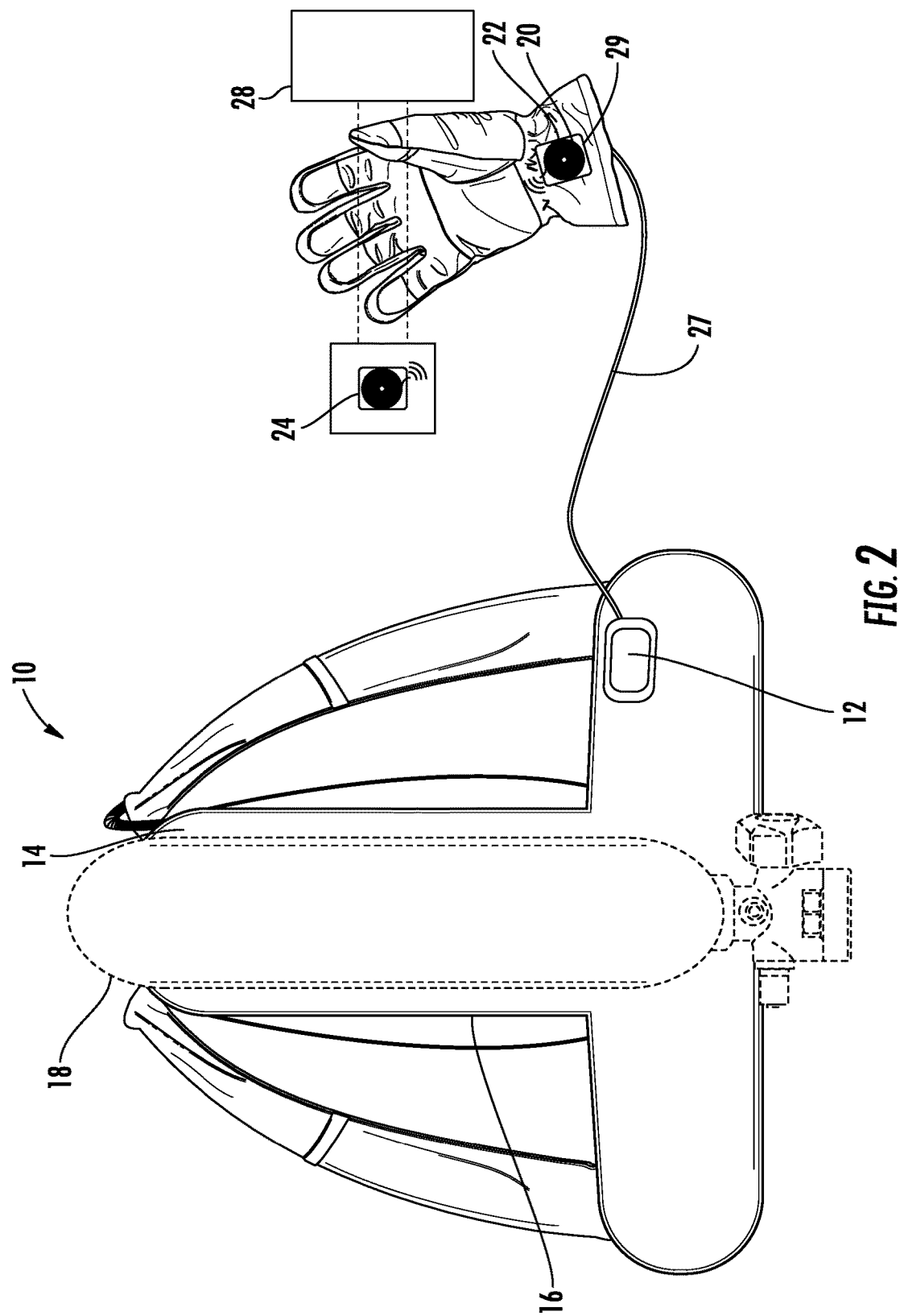
FIG. 2 is diagram of another embodiment a magnetic resonance coupling power system with a skin patch and portable device.

Now referring to the drawings in which like reference designators refer to like elements, there is shown in FIGS. 1-2, a magnetic resonance equipment powering system constructed in accordance with the principles of the present invention and designated generally as "10." The system 10 may include portable power source 12, for example, a battery, releasably coupled to life safety equipment 14 to be carried by a user, for example, first responder. The life safety equipment 14 may include a backpack assembly 16 with adjustable straps sized to be worn by the user around his or her torso, and may further include a self-contained breathing apparatus 18 and its associated respirator. In an exemplary configuration, the portable power source 12 is releasably mounted to the backpack assembly 16 when worn by the user, with the self-contained breathing apparatus 18 generally extending upward from the portable power source 12. The portable power source 12 may be charged, and recharged, by a conventional charging methods and may further include an outlet (not shown) for receiving a plug to provide power to other components. In an exemplary configuration, the portable power source 12 may be batteries including, but not limited to, Nickel Cadmium, Nickel Metal hydride, Lithium Ion, Lithium Polymer, Lithium Metal, or Lithium Sulfur Dioxide, although rechargeable batteries of any size are contemplated herein.

In electrical communication with the portable power source 12 may be a magnetic resonance coupling source 20. The magnetic resonance coupling source 20 is configured to wirelessly transmit electrical energy from the portable power source 12 to resonantly provide power to at least one portable device 28. The magnetic resonance coupling source 20 includes at least two magnetically coupled coils that are part of resonance circuits tuned to resonate at the same frequency. In particular, the magnetic resonance coupling source 20 includes a source or transmitter coil 22 in communication with at least one receiver coil 24. In one configuration, the source coil 22 is coupled to the portable power source 12 through a conductor 27, for example, a wire, extending away from the portable power source 12. In the configuration shown in FIG. 1, the source coil 22 may be coupled to a glove 26 sized to be worn by the user. The source coil 22 may be coupled to the inside or the outside of the glove 26, for example, by being sewn into the material of the glove 26 or inserted into a pocket formed in the glove 26. It is also contemplated that the source coil 22 may be affixed to or integrated with a turnout gear coat or other garment worn by first responder.

In the configuration shown in FIG. 2, the source coil 22 may be part of a skin patch 29 which is releasably adhered to the skin and may be releasably adhered to any portion of the user's body or clothing, for example, their hands or arms. When the portable power source 12 is activated, the source coil 22 wirelessly transmits power via resonance from the portable power source 12 to the at least one receiver coil 24 when the at least one receiver coil 24 is within a predetermined distance. For example, the range of transmission of the source coil 22 may be limited such that only receiver coils 24 within that distance can receive the power transfer. In one configuration, the range of the source coil 22 may be one meter or less, and in other configurations, a quarter meter or less.

The at least one receiver coil 24 may be coupled within or to a corresponding at least one portable device 28. The at least one portable device 28 may be those typically carried by first responders that require electricity and may include, but are not limited to, power tools, flashlights, cameras, gas detectors, locators, radios, PAPRs, other communication devices, and man down alarms. Each of such devices typically includes their own dedicated power source, which is typically a battery. The at least one portable device 28, however, may include its own dedicated battery that is configured to be charged by the energy received by the at least one receiver coil 24, or alternatively, may include no battery, and the at least one receiver coil 24 is configured to directly power the portable device 28 associated with that particular receiver coil 24. In one configuration, the magnetic resonance coupling source 20 is configured to charge a plurality of portable devices 28 simultaneously, for example, a portable device 28 in each of the user's hands. By removing the battery from its associated portable device 28, the weight of the associated portable device 28 is decreased, and thus the total weight the user may carry with the life safety equipment 14. In the configurations shown in FIGS. 1 and 2, the user may grip the handle of the portable device 28, which may bring the portable device 28 within the predetermined distance for power transfer between the source coil 22 and the at least one receiver coil 24. Any portable device 28 not within the predetermined position may not receive power and thus may not inadvertently activate. For example, the predetermined distance for resonance power transfer may be defined such that portable devices 28 coupled to the life safety equipment 14, for example, on a belt (not shown) around a user's waist may not receive power, but when the user grips the device and being the source coil 22 within the predetermined distance of the receiver coil 24, power may be transferred from the portable power source 12 to the portable device 28. Thus, the resonance charging feature described herein provides a safety feature for inadvertent activation of portable devices 28.

Figure 3:
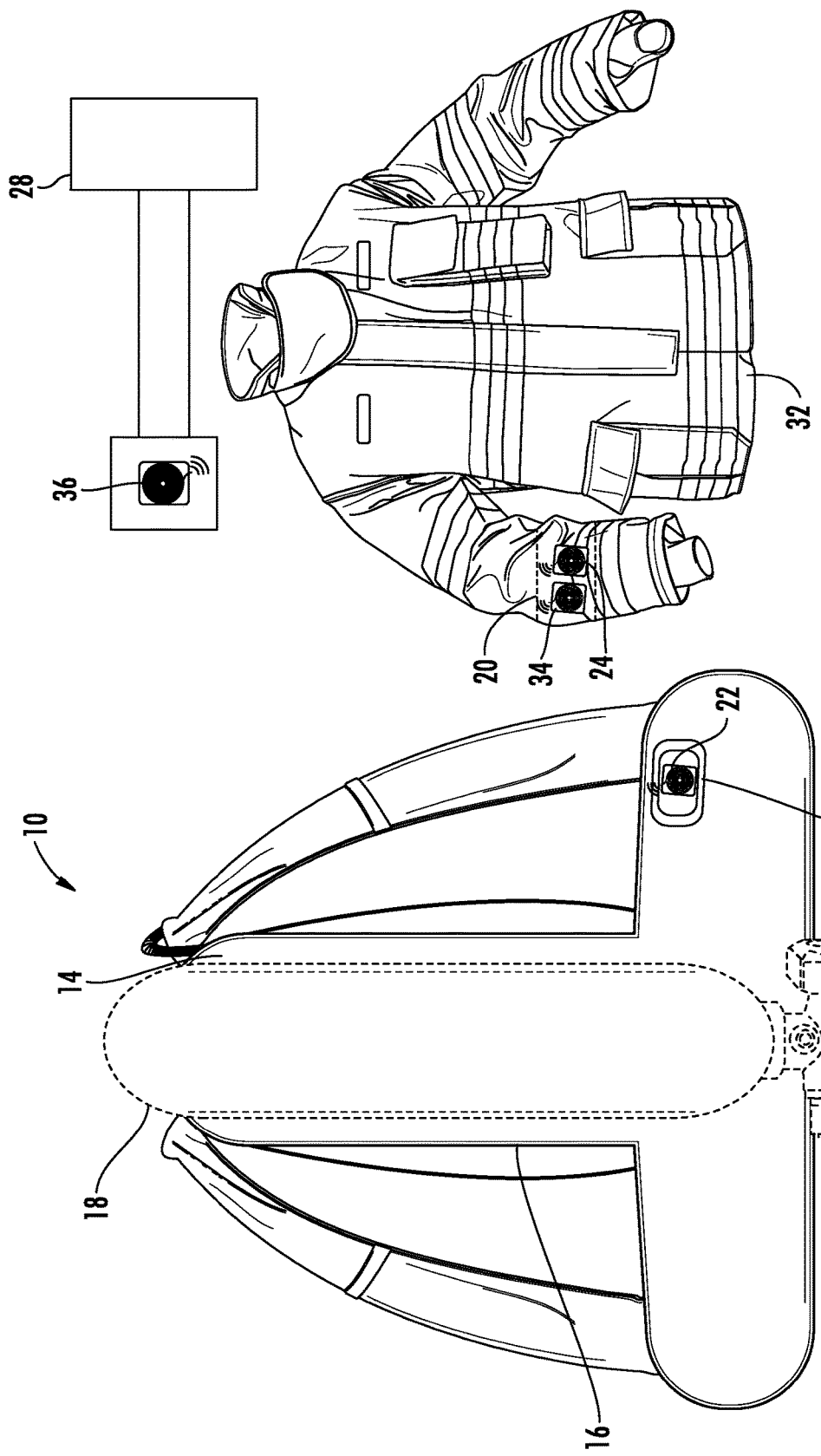
FIG. 3 is diagram of another embodiment a magnetic resonance coupling power system with a garment and portable device.

Referring now to FIG. 3, in another configuration of system 10, the source coil 22 may be directly coupled to the portable power source 12. In particular, the source coil 22 may be coupled to the life safety equipment 14 at the location of the portable power source 12, or proximate therefrom, such that that the source coil 22 receives power from the portable power source 12. The at least one receiver coil 24 may be coupled to a garment 30 configured to be worn by the user. For example, the garment 30 may be a firefighter's turnout gear 32. In a particular, configuration, the at least one receiver coil 24 is coupled to the inside or the outside of the sleeve of a jacket of the turnout gear 32 such that the at least one receiver coil 24 is within the predetermined distance for power transfer from the source coil 22. Proximate to the at least one receiver coil 24 may a second transmitter or source coil 34 in communication with the at least one receiver coil 24.

In one configuration, the second source coil 34 is configured to wirelessly receive power from the at least one receiver coil 24 by resonance inductive coupling. In such a configuration, the second source coil is 34 is within the predetermined distance to receive power by magnetic resonance inductive coupling. In another configuration, the at least one receiver coil 24 is electrically coupled to the second source coil 34 through the conductor 27 such as a wire. In such a configuration, the at least one receiver coil 24 and the second source coil 34 may be coupled together on a single substrate or may be separated by the length of the conductor 27. At least one second receiver coil 36 (e.g., magnetic resonance coupling receiver) may be positioned with in the predetermined distance of the second source coil 34 to wireless receive power through magnetic resonance inductive coupling power transfer. The at least one second receiver coil 36 may be coupled to the portable device 28 in the manner discussed above with respect to FIGS. 1 and 2, and power may be transferred from the second source coil 34 to the second receiver coil 36 to power the portable device 28. In one embodiment, as shown in FIG. 3, the magnetic resonance coupling source 20 may include the at least one receiver coil 24 and the second source coil 34.

Figure 4:
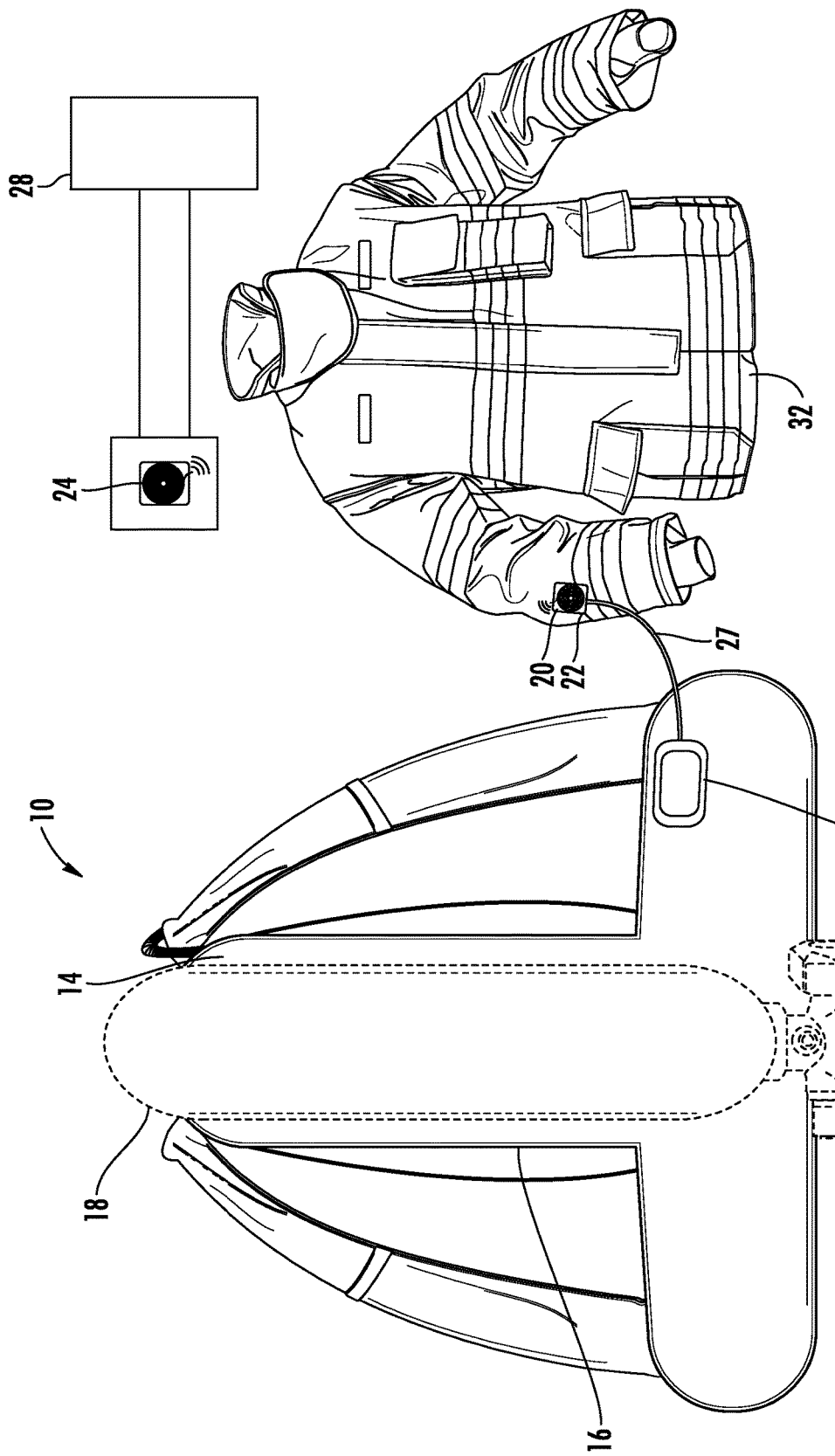
FIG. 4 is diagram another embodiment of the magnetic resonance coupling power system shown in FIG. 4 with a wired connection.

Now referring to FIG. 4, in an alternative configuration to the system 10 shown in FIG. 3, the conductor 27 may electrically couple the power source 12 directly to the source coil 22. For example, the conductor 27 may releasably couple to the garment 30 of the user, for example, by snaps, or other coupling mechanisms. Such a configuration allows the user to quickly attach the conductor 27 to his/her turnout gear 32. In the configuration shown in FIG. 4, the source coil 22 is coupled to the distal end of the conductor 27 proximate to the user's cuff on the garment 30. When the power source 12 is activated and the portable device 28 with the at least one receiver coil 24 is positioned with the predetermined distance for power transfer, power may be transferred wirelessly from the at least one source coil 22 to the at least one receiver coil 24 to power the portable device 28.

Figure 5:
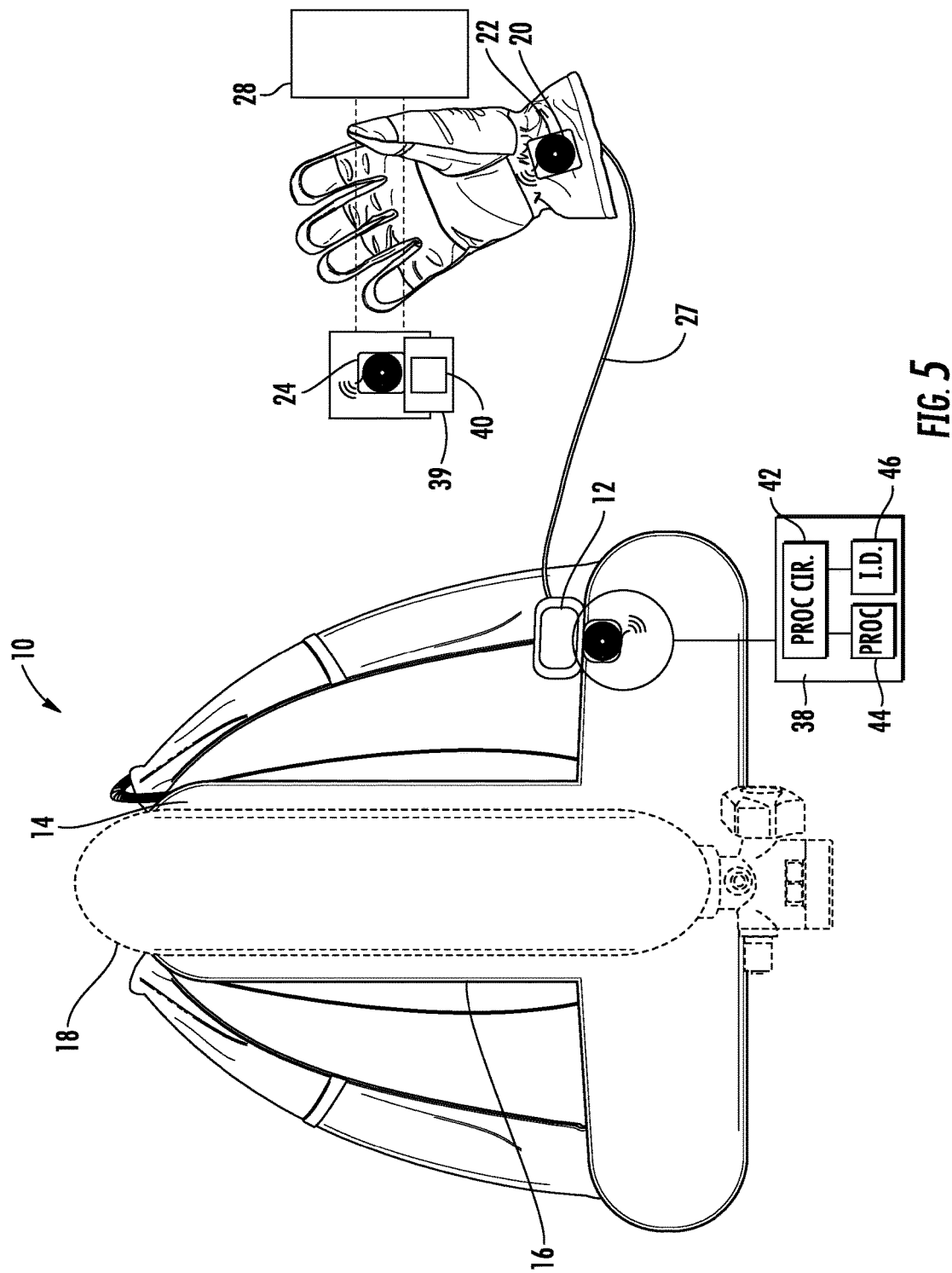
FIG. 5 is diagram of another embodiment a magnetic resonance coupling power system with a glove, portable device, and RFID authentication system.

Now referring to FIG. 5, in another configuration of the system 10 shown in FIG. 1, in addition to, or in substitution for, initiating a power transfer from the magnetic resonance coupling source 20 based on the distance between the source coil 22 and the at least one receiver coil 24, the system 10 may include an authentication/identification component such as a radio frequency identification ("RFID") system in communication with the portable power source 12 to authenticate portable devices 28 in order to initiate a power transfer from the portable power source 12 to the at least one receiver coil 24. In such an arrangement, power transfer from the power source 12 to the portable device 28 is permitted only if the portable device 28 is authenticated as being associated with the user and/or life safety equipment 14.

In the configuration shown in FIG. 5, the power source 12 includes a radio frequency identification (RFID) or near field communication (NFC) reader 38 configured to interrogate devices within the range of the reader 38 to cause RFID elements 39 within range to transmit portable device identifiers 40 device associated with a plurality of corresponding portable devices 28. In other words, each portable device 28 has an RFID element 39 that stores a portable device identifier 40 unique to that device. The radio frequency identification (RFID) or near field communication (NFC) reader 38 may also be separate from the power source 12, but arranged to allow the power source 12 to provide power only if the portable device 28 is properly authenticated.

The RFID element 39 may include transmitters, receivers, and authentication processing circuitry 42 including integrated circuitry for processing and/or control, e.g., one or more processors 44 and/or processor cores and/or FPGAs (Field Programmable Gate Array) and/or ASICs (Application Specific Integrated Circuitry). One or more processor 44 may be configured to access (e.g., write to and/or reading from) memory, which may comprise any kind of volatile and/or non-volatile memory, e.g., cache and/or buffer memory and/or RAM (Random Access Memory) and/or ROM (Read-Only Memory) and/or optical memory and/or EPROM (Erasable Programmable Read-Only Memory). Such memory may be configured to store code executable by one or more processor 44 and/or other data, e.g., data pertaining to communication, e.g., configuration and/or address data of nodes, etc. In this configuration, the memory may be configured to store a plurality of authorized portable device identifiers 46 as well as programmatic authentication code.

The one or more processors 44 may cause the RFID reader 38 to interrogate portable devices 28 within an interrogation range and cause the RFID elements in those portable devices to transmit the stored portable device identifier 40. The RFID reader 38 receives the portable device identifier 40 associated with the portable device 28 and determines whether the received portable device identifier 40 corresponds to one of the plurality of authorized portable device identifiers 46. For example, the portable device identifiers 40 may be one or more alpha, numeric or alpha-numeric characters associated with a corresponding portable device 28.

The RFID element 39 storing the portable device identifier 40 may be an active RFID element 39, i.e., powered, or passive. For example, the portable device identifier 40 may have its own dedicated battery for transmitting its identifier or may be powered in whole or part by the interrogation signal received from the reader 38. When the portable device 28 is brought within a predetermined distance of the reader 38, e.g., the read/interrogation range of the reader 38, the reader 38 may determine whether the portable device identifier 40 corresponds to one of the plurality of authorized portable device identifiers 46. If the portable device identifier 40 matches one of the plurality of authorized portable device identifiers 40, the processor 44 may cause the portable power source 12 to initiate the flow of power from the magnetic resonance coupling source 20 to the at least one receiver coil 24.

In one configuration, the portable device 28 must be both within the predetermined distance for magnetic resonance power transfer, be within the range for RFID authentication discussed above, and be authenticated, before power transfer is initiated. Such a configuration provides for an additional safety feature to prevent unintended devices from being powered and actuated. In particular, the reader 38 may include the plurality of authorized portable device identifiers 46 corresponding to the portable devices 28 of a particular user, and no other users. That is, portable devices 28 of one user may not receive power from another user's portable power source 12 and vice versa. The RFID system described herein may be incorporated with any of the embodiments of the system 10 discussed above, including those described with reference to FIGS. 1-4. Further, the plurality of authorized portable device identifiers 46 may updated over time to include other portable device identifiers 40 and/or to exclude portable device identifiers 40. Although RFID authentication is described herein, it is also contemplated that authentication of the portable tools 28 may be achieved through other forms of wireless communication such as bump pairing, Bluetooth or Bluetooth low energy.

Figure 6:
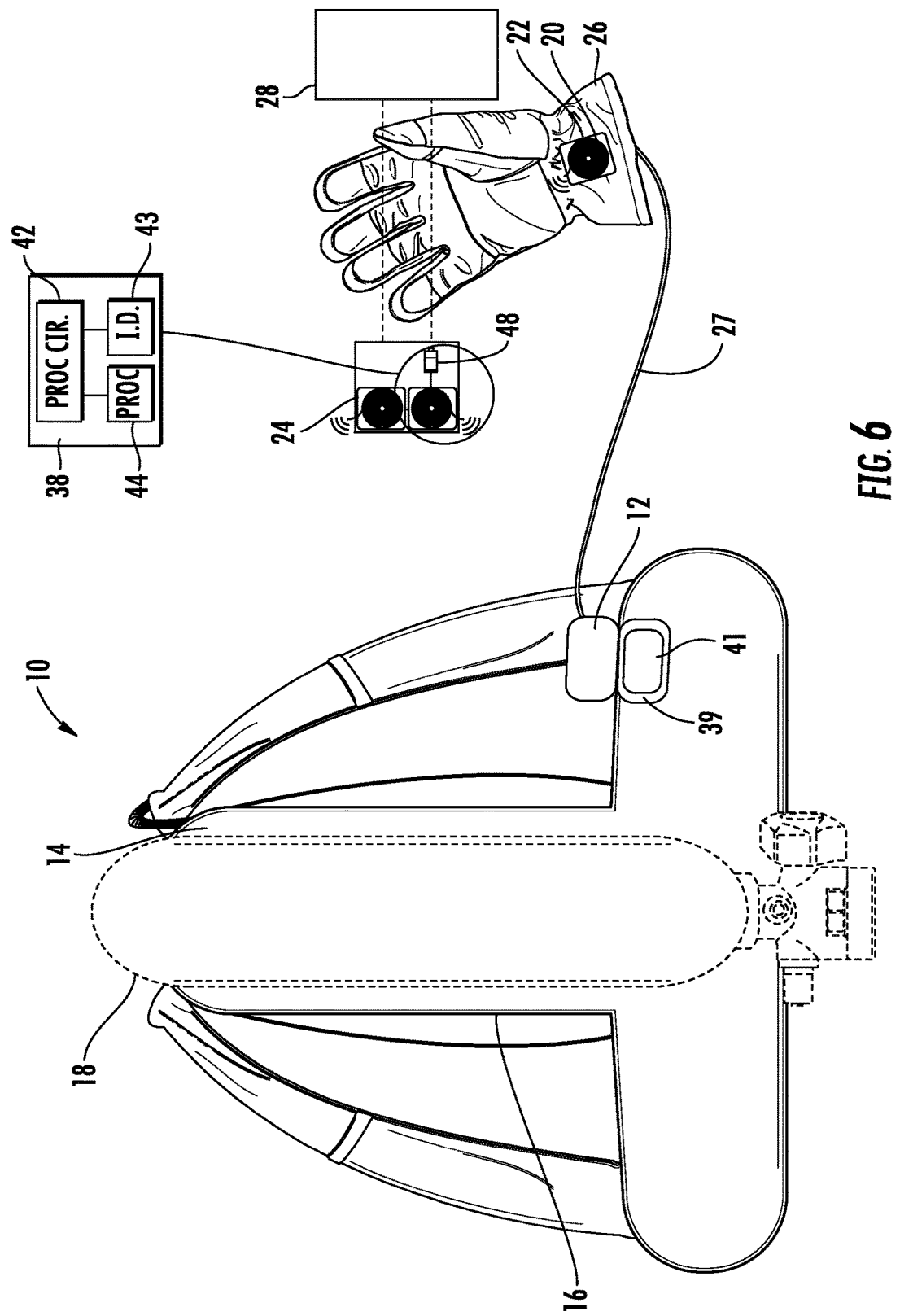
FIG. 6 is diagram of another embodiment a magnetic resonance coupling power system with a glove, portable device, and RFID authentication system.

Referring now to FIG. 6, in alternative configuration of the RFID system shown in FIG. 5, the reader 38 is coupled to or within the portable device 28. In this case, the RFID element 39 is coupled to or part of the power source 12 and stores a power source or user identifier (ID) 41. In this configuration, the reader 38 may include its own dedicated battery 48 within the portable device 28 to provide power to the reader 38. The reader 38 in the portable device 28 authenticates the power source 12, e.g., a power source 12 associated with the user device by matching the power source ID 41 with one of the prestored authorized users or power source IDs 43. A matching of the power source ID 41 with one of the authorized user or power source IDs 43 means that the portable device 28 is authorized to use power received from the power source 12. In other words, the portable device 28 can only be activated for use if the power source ID 41 read from the power source 12 is authenticated as a verified power source (or verified user). Put another way, the portable device 28 is caused to use the power received from the at least one magnetic resonance coupling receiver 24 when the received power source ID 41 corresponds to an authorized power source ID 43. The plurality of authorized power source IDs 43 may be updateable in the manner described with respect to the authorized device identifiers 46 in the embodiment disclosed in FIG. 5. Moreover, the RFID system described in this configuration may be incorporated with any of the embodiments of the system 10 discussed above with respect to FIGS. 1-4. Although RFID authentication is described herein, it is also contemplated that authentication of the portable tools 28 may be achieved through other forms of wireless communication such as bump pairing, Bluetooth or Bluetooth low energy.

Figure 7:
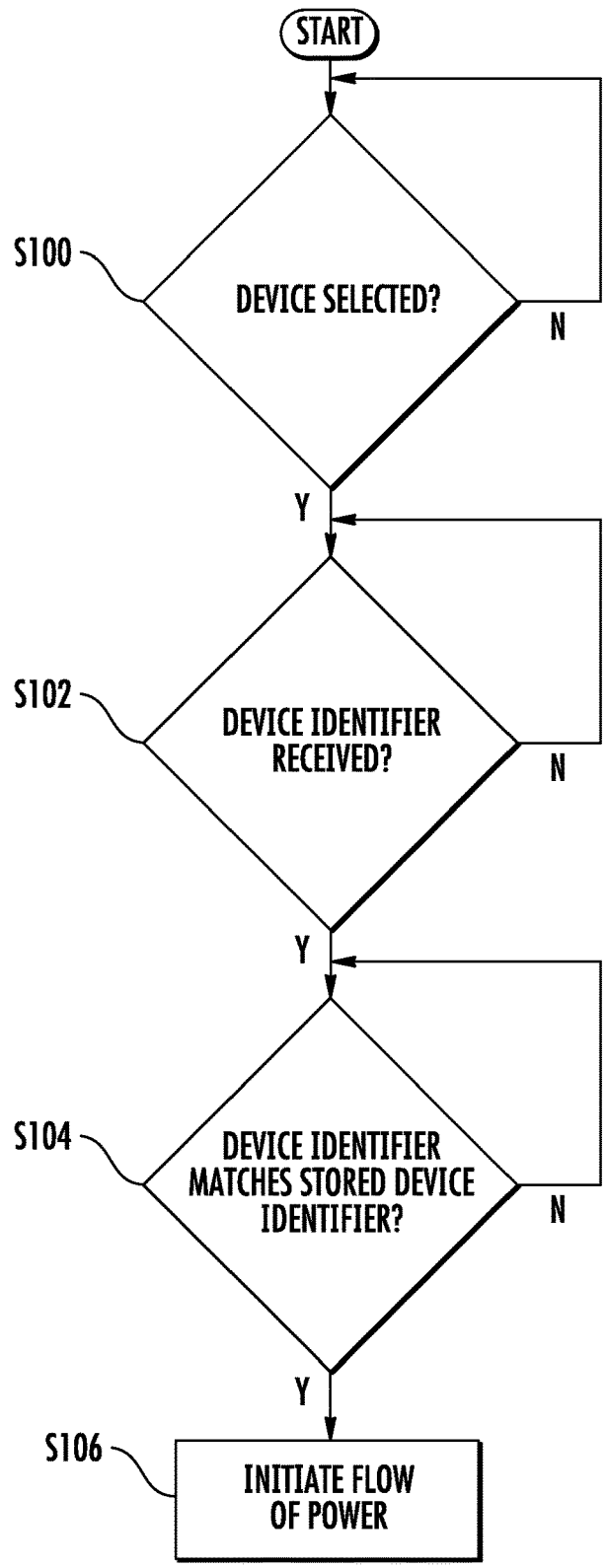
FIG. 7 is a flow chart of a portable device authentication method for magnetic resonance power transfer.

Referring now to FIG. 7, in an exemplary method of authenticating portable devices 28 for the transfer of power from the portable power source 12 to the portable device 28 such as the embodiment of FIG. 5, the user may select one of the at least one portable devices 28, which may be releasably coupled to, for example, the backpack assembly 16 of the lifesaving equipment 14 (Step S100). The reader 38 interrogates the RFID element 39 and receives the portable device identifier 40 (Step S102). In one configuration, the RFID element 39 is powered by battery 48 and actively transfers the portable device identifier 40 to the reader 38. In another configuration, the RFID element 39 is passive and is wirelessly powered by the interrogation signal received from the reader 38, which causes the portable device identifier 40 to be read from the RFID element 39 and transmitted to the reader 38. When the portable device identifier 40 is received by the reader 38, the reader 38 determines whether the received portable device identifier 40 corresponds to one of the plurality of authorized portable device identifiers 46 (Step S104). If the portable device 28 is authenticated, the reader 38 causes the portable power source 12 to initiate the flow of power from the magnetic resonance coupling source 20 to the at least one receiver 24 (Step 106). If the portable device 28 includes a power switch, the user actuate the power switch before or after power is transfer is initiated.

Figure 8:
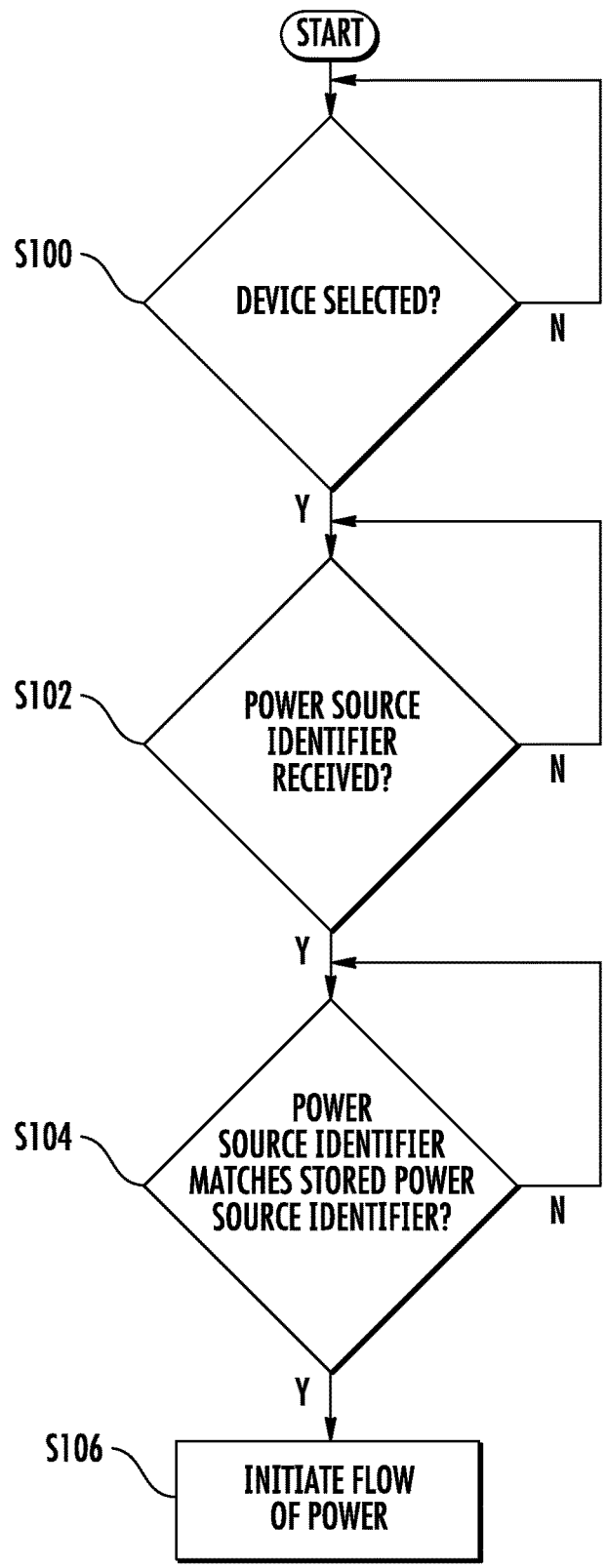
FIG. 8 is a flow chart of another portable device authentication method for magnetic resonance power transfer.

Referring now to FIG. 8, in another exemplary method of authenticating portable devices 28 for the transfer of power from the portable power source 12 to the portable device 28 such as the embodiment of FIG. 6, the user may select one of the at least one portable devices 28, which may be releasably coupled to, for example, the backpack assembly 16 of the lifesaving equipment 14 (Step S100). The reader 38 interrogates the RFID element 39 and receives the power source ID 41 (Step S102). In one configuration, the RFID element 39 is powered by battery 48 and actively transfers the power source ID 41 to the reader 38. In another configuration, the RFID element 39 is passive and is wirelessly powered by the interrogation signal received from the reader 38, which causes the power source ID 41 to be read from the RFID element 39 and transmitted to the reader 38. When the power source ID 41 is received by the reader 38, the reader 38 determines whether the received power source ID 41 corresponds to one of the plurality of authorized power source IDs 43 (Step S104). If the portable device 28 is authenticated, the reader 38 causes the portable power source 12 to initiate the flow of power from the magnetic resonance coupling source 20 to the at least one receiver 24 (Step 106). If the portable device 28 includes a power switch, the user actuate the power switch before or after power is transfer is initiated.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

The invention claimed is:

1. A magnetic resonance equipment powering system, comprising:
   a portable power source couplable to a life safety equipment, the portable power source including a power source magnetic resonance coupling source; and
   a magnetic resonance coupling source, the magnetic resonance coupling source being in electrical communication with the portable power source, the magnetic resonance coupling source being configured to wirelessly transmit power to at least one magnetic resonance coupling receiver included in a portable device when the at least one magnetic resonance coupling receiver is positioned within a maximum predetermined distance from the magnetic resonance coupling source, the magnetic resonance coupling source being separated from the portable power source and including a receiver coil and a source coil, the receiver coil configured to receive wireless power from the power source magnetic resonance source and the source coil configured to transmit wireless power to the at least one magnetic resonance coupling receiver.

2. The system of claim 1, further including a garment, and wherein the at least one magnetic resonance coupling source is affixed to the garment.

3. The system of claim 2, wherein the garment includes a sleeve, and wherein the at least one magnetic resonance coupling source is coupled to the sleeve.

4. The system of claim 2, wherein the garment is a firefighter turnout gear.

5. The system of claim 1, further including a glove, and wherein the at least one magnetic resonance coupling source is coupled to the glove.

6. The system of claim 1, further including an adhesive skin patch, and wherein the at least one magnetic resonance coupling source is coupled to the skin patch.

7. The system of claim 1, wherein the magnetic resonance coupling source is connected with the portable power source by a conductor.

8. The system of claim 1, further including:
   a radio frequency identification (RFID) reader, the RFID reader being configured to receive a portable device identifier associated with the portable device;
   authentication processing circuitry, the authentication processing circuitry including:
      a memory configured to store:
         a plurality of authorized portable device identifiers; and
         programmatic authentication code; and
      a processor in communication with the memory, the processor executing the programmatic authentication code to:
   cause the RFID reader to receive the portable device identifier associated with the portable device;
   determine whether the received portable device identifier corresponds to an authorized portable device identifier; and
   cause the portable power source to initiate the flow of power from the magnetic resonance coupling source to the at least one magnetic resonance coupling receiver when the received portable device identifier corresponds to an authorized portable device identifier.

9. The system of claim 8, further including the portable device, and wherein the portable device includes the portable device identifier.

10. The system of claim 1, further including the portable device, the portable device having:
   a radio frequency identification (RFID) reader, the RFID reader being configured to receive a power source identifier associated with the portable power source;
   authentication processing circuitry, the authentication processing circuitry including:
      a memory configured to store:
         a plurality of authorized power source identifiers; and
         programmatic authentication code; and
      a processor in communication with the memory, the processor executing the programmatic authentication code to:

cause the RFID reader to receive the power source identifier associated with the portable power source;
determine whether the received power source identifier corresponds to an authorized power source identifier; and
cause the portable device to use the power received from the at least one magnetic resonance coupling receiver when the received power source identifier corresponds to an authorized power source identifier.

11. The system of claim 1, wherein the life safety equipment includes a backpack assembly, and wherein the backpack assembly is configured to receive a self-contained breathing apparatus.

12. A magnetic resonance equipment powering system, comprising:
a portable power source couplable to a life safety equipment, the portable power source including a power source magnetic resonance coupling source; and
a magnetic resonance coupling source remote from the portable power source, the magnetic resonance coupling source being in electrical communication with the portable power source, the magnetic resonance coupling source being configured to wirelessly transmit power to at least one magnetic resonance coupling receiver included in a portable device when the at least one magnetic resonance coupling receiver is positioned within a maximum predetermined distance from the magnetic resonance coupling source, the magnetic resonance coupling source being separated from the portable power source and including a receiver coil and a source coil, the receiver coil configured to receive wireless power from the power source magnetic resonance source and the source coil configured to transmit wireless power to the at least one magnetic resonance coupling receiver; and
the magnetic resonance coupling source being coupled to a garment.

13. The system of claim 12, wherein the magnetic resonance coupling source is connected with the portable power source by a conductor.

14. The system of claim 12, further including:
a radio frequency identification (RFID) reader, the RFID reader being configured to receive a portable device identifier associated with the portable device;
authentication processing circuitry, the authentication processing circuitry including:
a memory configured to store:
a plurality of authorized portable device identifiers; and
programmatic authentication code; and
a processor in communication with the memory, the processor executing the programmatic authentication code to:
cause the RFID reader to receive the portable device identifier associated with the portable device;
determine whether the received portable device identifier corresponds to an authorized portable device identifier; and
cause the portable power source to initiate the flow of power from the magnetic resonance coupling source to the at least one magnetic resonance coupling receiver when the received portable device identifier corresponds to an authorized portable device identifier.

15. The system of claim 12, wherein the garment is a glove.

16. The system of claim 12, wherein the garment is a jacket having a sleeve, and wherein the at least one magnetic resonance coupling receiver is coupled to the sleeve.

17. The system of claim 12, wherein the life safety equipment includes a backpack assembly, and wherein the backpack assembly is configured to receive a self-contained breathing apparatus.

18. A magnetic resonance equipment powering system, comprising:
a portable power source couplable to a life safety equipment, the life safety equipment including a backpack assembly configured to receive a self-contained breathing apparatus, and the portable power source including a power source magnetic resonance coupling source;
a magnetic resonance coupling source physically coupled to the portable power source, the magnetic resonance coupling source being in electrical communication with the portable power source, the magnetic resonance coupling source being configured to wirelessly transmit power to at least one magnetic resonance coupling receiver included in a portable device when the at least one magnetic resonance coupling receiver is positioned within a maximum predetermined distance from the magnetic resonance coupling source, the magnetic resonance coupling source being separated from the portable power source and including a receiver coil and a source coil, the receiver coil configured to receive wireless power from the power source magnetic resonance source and the source coil configured to transmit wireless power to the at least one magnetic resonance coupling receiver; and
the magnetic resonance coupling source being coupled to a garment configured to be worn by the user.

* * * * *